(12) United States Patent
Radovanov et al.

(10) Patent No.: US 9,024,282 B2
(45) Date of Patent: May 5, 2015

(54) TECHNIQUES AND APPARATUS FOR HIGH RATE HYDROGEN IMPLANTATION AND CO-IMPLANTION

(71) Applicant: Varian Semiconductor Equipment Associates, Inc., Gloucester, MA (US)

(72) Inventors: Svetlana B. Radovanov, Brookline, MA (US); Ludovic Godet, Boston, MA (US); Anthony Renau, West Newbury, MA (US); Xianfeng Lu, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 120 days.

(21) Appl. No.: 13/791,141

(22) Filed: Mar. 8, 2013

(65) Prior Publication Data

US 2014/0256121 A1    Sep. 11, 2014

(51) Int. Cl.
*G21K 5/00* (2006.01)
*H01L 21/265* (2006.01)

(52) U.S. Cl.
CPC .................................. *H01L 21/2658* (2013.01)

(58) Field of Classification Search
CPC .. A47C 7/74; H01J 2237/31701; H01J 37/08; Y10S 438/961
USPC ............... 250/492.1–492.3, 423 R, 424, 426, 250/423 F
See application file for complete search history.

(56) References Cited

U.S. PATENT DOCUMENTS

| | | | |
|---|---|---|---|
| 4,894,549 A * | 1/1990 | Stengl | 250/492.2 |
| 6,358,313 B1 | 3/2002 | Tsuchimoto et al. | |
| 6,927,148 B2 | 8/2005 | Ito | |
| 7,323,398 B2 | 1/2008 | Akatsu | |
| 7,820,524 B2 | 10/2010 | Miyairi et al. | |
| 7,829,434 B2 | 11/2010 | Yamazaki et al. | |
| 2009/0084988 A1 * | 4/2009 | Blake et al. | 250/492.21 |
| 2009/0232981 A1 | 9/2009 | Blake et al. | |
| 2011/0207306 A1 * | 8/2011 | Cherekdjian et al. | 438/513 |
| 2012/0025274 A1 | 2/2012 | Ohnuma et al. | |
| 2012/0129324 A1 * | 5/2012 | Cherekdjian | 438/513 |
| 2012/0168622 A1 * | 7/2012 | Benveniste et al. | 250/298 |
| 2013/0001414 A1 * | 1/2013 | Benveniste et al. | 250/282 |

* cited by examiner

*Primary Examiner* — Michael Maskell

(57) ABSTRACT

An apparatus for hydrogen and helium implantation is disclosed. The apparatus includes a plasma source system to generate helium ions and hydrogen molecular ions comprising $H_3^+$ ions. The apparatus further includes a substrate chamber adjacent the plasma source system and in communication with the plasma source system via one or more apertures, an extraction system to extract the hydrogen molecular ions and helium ions from the plasma source system, and an acceleration system to accelerate extracted helium and hydrogen molecular ions to a predetermined energy and direct the extracted helium ions and hydrogen molecular ions to a substrate.

14 Claims, 10 Drawing Sheets

TECHNIQUES AND APPARATUS FOR HIGH RATE HYDROGEN IMPLANTATION AND CO-IMPLANTION

FIELD

This disclosure relates to ion implantation and in particular to hydrogen ion implantation.

BACKGROUND

Ion implant systems for Silicon On Insulator (SOI) substrate processing are currently based upon the implantation of hydrogen and helium ions into a semiconductor substrate at the same depth range ($R_p$). Previously, H-implantation in Si marked the beginning of a new era in the electronic industry when it was first coupled with the direct wafer bonding technique. This coupled process is now generally referred to as an ion-cut process, or smart cut, because the ion implantation is used to sever a portion (layer) of a semiconductor wafer from a remaining portion of the semiconductor wafer.

Generally the separation process to produce a substrate for subsequent smart cut processing is produced by chemical interaction such as bond breaking and passivation and a physical interaction such as gas coalescence, pressure and fracture, of implanted hydrogen ions in a semiconductor substrate. Helium, which may be used to assist smart cut processing, is a noble gas and does not produce a chemical interaction in a silicon substrate as does hydrogen. However, helium does induce a physical interaction and in a more efficient manner than hydrogen.

In current practice He and H co-implantation creates a buried damage layer having a large number of fine voids which form a weakened region that can be used to delaminate a portion of the wafer during subsequent processing. This technique forms the basis of generating high quality SOI wafers that may be used for device fabrication. The technique has recently been extended for use with Ge and SiGe wafer processing as well as processing compound semiconductor wafers. In current technology for processing silicon wafers, a high current (HC) Hydrogen implanter may be employed to process wafers in which a high dose of implanting ions is used to process wafers. For example, the HC implanters may use a high mass resolution beam line components to implant both $H^+$ and $He^+$ at dose ~$10^{16}$ to ~$10^{17}$ ions/cm$^2$, and at energies in the range of 20 to 100 KeV. This process is rather slow, expensive and requires very high concentrations of Hydrogen atoms.

In view of the above, it will be appreciated that there is a need to develop ion implantation technology to enhance ion introduction efficiency, to provide a low material cost and high implant productivity system for SOI processing.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment an apparatus for hydrogen and helium implantation includes a plasma source system to generate helium ions and hydrogen molecular ions comprising $H_3^+$ ions. The apparatus further includes a substrate chamber adjacent the plasma source system and in communication with the plasma source system via one or more apertures, an extraction system to extract the hydrogen molecular ions and helium ions from the plasma source system, and an acceleration system to accelerate extracted helium and hydrogen molecular ions to a predetermined energy and direct the extracted helium ions and hydrogen molecular ions to a substrate.

In a further embodiment, a method to process a substrate using ion implantation includes generating hydrogen molecular ions comprising $H_3^+$ ions in a first set of plasma conditions during a first set of implantation periods, generating helium ions in a second set of plasma conditions during a second set of implantation periods, directing a first ion beam containing the $H_3^+$ ions to the substrate during the first set of implantation periods; and directing a second ion beam containing the helium ions to the substrate during the second set of implantation periods.

DETAILED DESCRIPTION

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Various embodiments involve apparatus and methods to perform hydrogen and helium implantation into a substrate. In particular, apparatus and methods are disclosed to direct high current hydrogen ion beams to a substrate. The present embodiments facilitate high throughput ion implantation for applications such as hydrogen and helium ion co-implantation for SOI wafer preparation. In various embodiments co-implantation according to the apparatus and techniques disclosed herein may also be used to prepare materials such as Germanium-on-insulator (GeOI), GaNO.

In various embodiments a processing system includes a plasma source system that contains one or more plasma sources to generate hydrogen and helium ions. The plasma source system is coupled to a substrate chamber via one or more extraction systems and acceleration systems. For example in an embodiment in which the plasma source system contains a single plasma source, helium and hydrogen ions are generated in the same plasma source. In such a system the extraction system is a single extraction assembly coupled to the single plasma source, and the acceleration system is a single acceleration assembly coupled to the single extraction assembly. In an embodiment in which the plasma source system contains two plasma sources, each may be dedicated to hydrogen or helium ion production. In such a system the extraction system contains two extraction assemblies coupled to the two different respective plasma sources, and the acceleration system contains two acceleration assemblies coupled to the respective two different extraction assemblies.

Figure 1A:
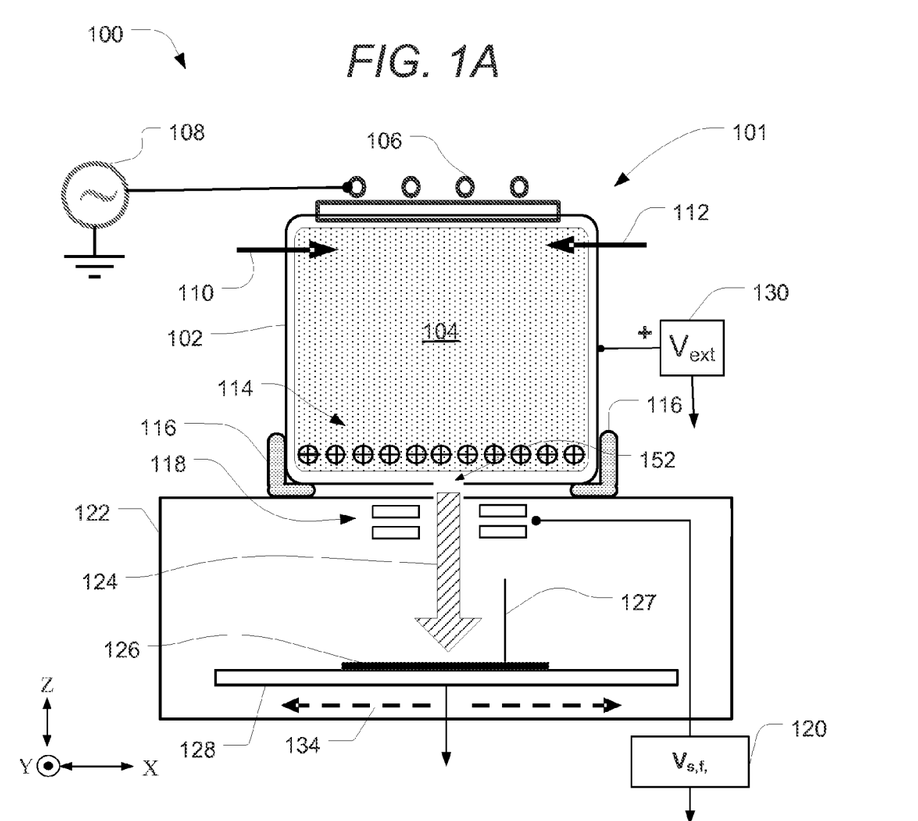
FIG. 1A depicts a side view of a processing system consistent with the present embodiments.
Figure 1B:
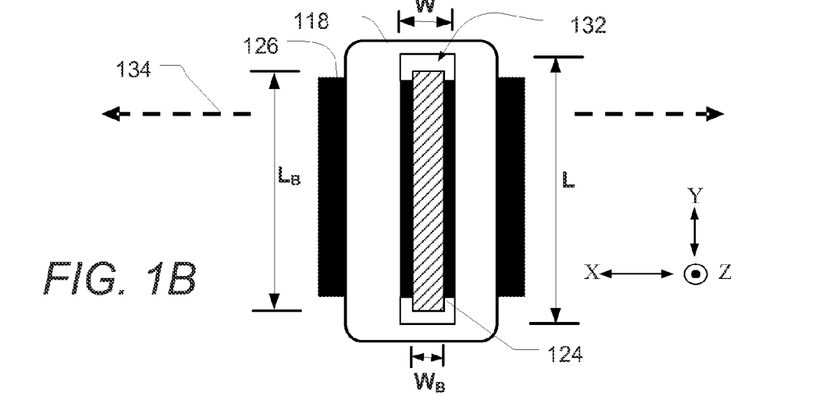
FIG. 1B depicts a top view of the extraction assembly and substrate of processing system of FIG. 1A.

FIG. 1A depicts a side view of a processing system 100 consistent with the present embodiments. The processing system 100 includes a plasma source 101 that is configured to generate plasma 104 from which ions may be extracted to perform implantation into a substrate. The plasma source 101 may include a plasma source chamber 102 and induction coil 106. The plasma 104 is generated by when a power source supplies energy to the induction coil 106. In the embodiment of FIG. 1B, an RF generator 108 is configured to supply radio frequency (RF) power to the induction coil 106. The processing system 100 includes gas inlet 110 and gas inlet 112 which are configured to supply gas to the plasma source chamber 102. When RF power is supplied to the induction coil 106 while gas is admitted into the plasma source chamber 102, plasma 104 may be ignited. Although FIG. 1A depicts that the plasma 104 is generated by an RF coil 106, in other embodiments other known techniques may be used to generate the plasma 104. For example, a plasma source for the plasma 104 may, in various embodiments, be an in situ or remote, inductively coupled plasma source, capacitively coupled plasma source, helicon source, microwave source, or any other type of plasma source. For example, H2 may be admitted through gas inlet 112, while He is admitted through gas inlet 110. As shown in FIG. 1A, the processing system 100 also includes a substrate chamber 122 adjacent the plasma source chamber that includes a substrate stage 128 to support one or more substrates 126. In accordance with the present embodiments, ions 114 generated in the plasma 104 may be extracted through an aperture 152 in the plasma source chamber 102, thereby forming an ion beam 124 to implant into a substrate 126. The plasma source chamber 102 may be electrically isolated from the substrate chamber 122 by means of insulator 116.

As illustrated, the voltage source Vext 130 may set a positive voltage (also termed "Vext") for the plasma source chamber 102, thereby setting a positive potential of the plasma 104. An ion beam 124 may be extracted when an extraction assembly 118 receives a voltage from the extraction assembly voltage supply (Vs,f) 120 that is negative with respect to Vext.

FIG. 1B depicts a top view of the extraction assembly 118 and substrate 126 of processing system 100 with other components removed for clarity. As illustrated in FIG. 1B, in various embodiments the extraction assembly 118 includes one more plates (electrodes) having an aperture(s) 132 that has a length L and width W. In various embodiments, the dimensions of L and W are such that the ion beam 124 assumes the shape of a "ribbon beam." In particular, the ion beam 124 may be defined by direction of propagation along the "Z" direction as shown in the Cartesian coordinate system of FIG. 1A. The cross-section of the ion beam 124 is represented by the top view shown in FIG. 1B which shows a perspective of the ion beam 124 in the X-Y plane of the Cartesian coordinate system of FIG. 1A. As shown the cross section of ion beam 124 is shaped by the aperture 132 and is characterized by a cross-sectional width WB and a cross sectional length LB, which may be at least twice as large as WB in various embodiments.

In operation, the substrate stage 128 may be translated along the direction 134 that is parallel to the X-axis while the substrate 126 is exposed to ion beam 124. As further illustrated in FIG. 1B, the cross-sectional width WB of the ion beam 124 may extend to cover an entire substrate 126 along the direction parallel to the Y-axis. Accordingly, when the substrate stage is moved along the direction 134 the entire substrate 126 may be exposed to ion beam 124.

Figure 2:
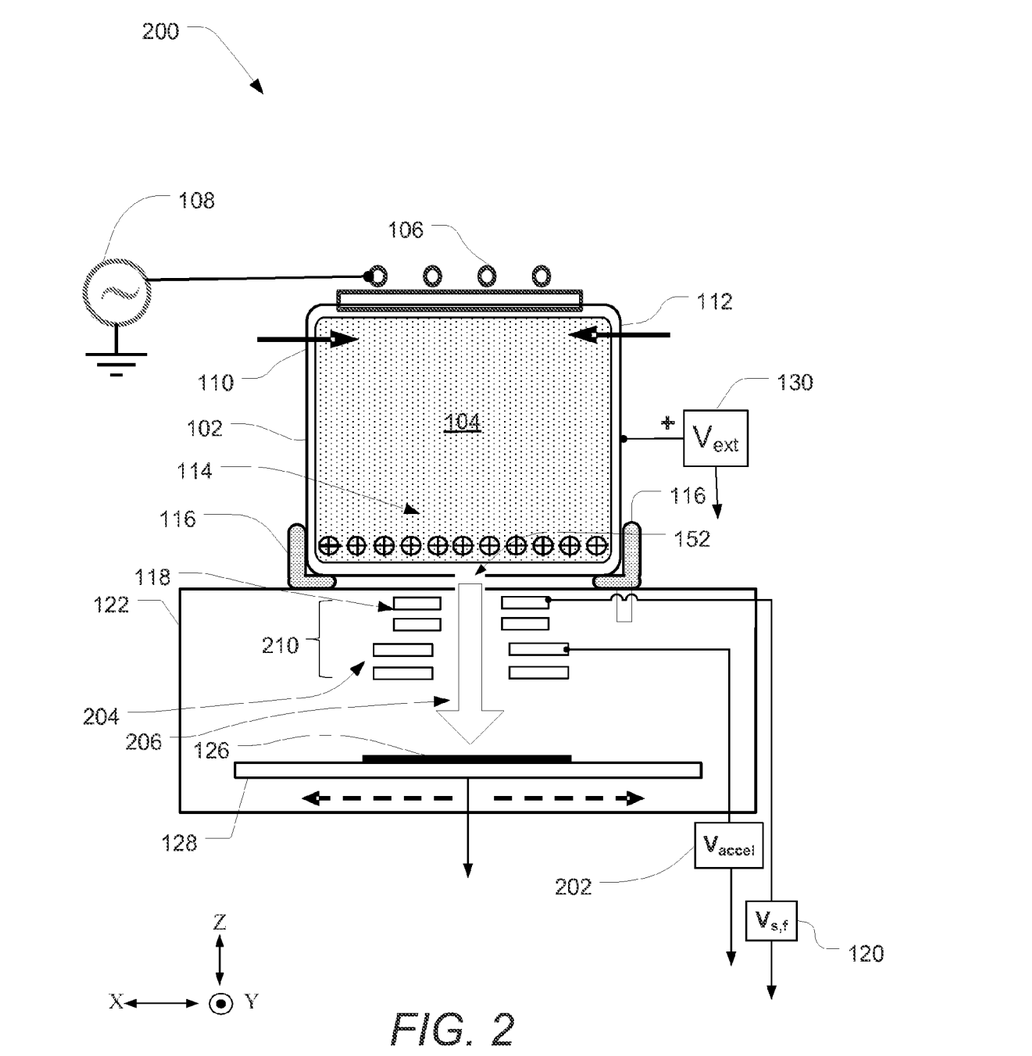
FIG. 2 depicts a processing system variant of the processing system of FIG. 1A.

In various embodiments, the plasma 104 may generate a high concentration of hydrogen molecular ions, which are extracted in the ion beam 124 and implanted into substrate 126. This provides an advantage over conventional beamline hydrogen implantation apparatus which typically provide a mass analyzed monatomic beam of H+ for implantation into a substrate. Because the ion beam 124 may include a high fraction of H3+ ions the rate of implantation of hydrogen may be much larger than for beamline implantation apparatus since each H3+ ion may implant up to 3 hydrogen atoms when impinging on a substrate 126. In conjunction with implantation of Helium ions, the increased rate of hydrogen implantation may facilitate a much higher throughput for processing substrates 126 for smart cut or related processing. For example, in a first procedure the processing system 100 may implant helium ions into the substrate 126, which is followed by implantation of the appropriate dose of hydrogen ions to produce a substrate for subsequent smart cut processing in which the substrate 126 is delaminated at an interface within the substrate 126 created by the helium and hydrogen implantation processes. In various embodiments, in order to facilitate generation of high ion energies for implantation, an acceleration system is provided in addition to an extraction assembly. FIG. 2 depicts a processing system 200 which is a variant of the processing system 100. In particular, the processing system 200 may include the same features as processing system 100 with the addition of an acceleration assembly 204 that is disposed between the extraction assembly 118 and substrate stage 128. In various embodiments the extraction assembly 118 and acceleration assembly 204 may form part of a common lens system 210 that is used to accelerate and shape the ion beam 206. For example, a voltage supply Vaccel 202 may apply a voltage to the acceleration assembly 204 to accelerate ions to energies in the range of 5 keV to 100 keV according to the desired implant depth or range (Rp) for the species to be implanted.

In one implementation, the processing system 100 or processing system 200 may generate a helium plasma and a hydrogen plasma in a sequential fashion to produce respective helium and hydrogen ion beams for a co-implantation process into the substrate 126. For example, processing system 200 may initially generate a helium plasma by admitting helium gas through the gas inlet 110 in order to expose the substrate 126 to helium ions at the desired ion dose and ion energy may be extinguished and hydrogen flow through gas inlet 112 commenced in order to establish a hydrogen plasma in the plasma source chamber 102. It is to be noted that the co-implantation of hydrogen and helium ions requires much lower total dose of ion implantation than that of hydrogen or helium implanted alone. This shortens implantation time and decreases crystal damage induced by implantation.

In order to improve implantation processing throughput, plasma parameters are tuned in the plasma source chamber 102 to generate an H3+ ion beam at a desired energy to implant hydrogen to a second predetermined depth which may differ from the first predetermined depth for helium implantation. By generating molecular hydrogen ions, and in particular, H3+ ions, the rate of hydrogen implantation into substrate 126 can be increased substantially over that achieved by H+ ion implantation. For example, for a given ion beam current, the rate of hydrogen implantation (H/sec) achieved using implantation by a pure H3+ ion beam is three times that achieved using a pure H+ ion beam. Accordingly, a predetermined hydrogen ion dose may be implanted into the substrate 126 three times faster. Notably, the energy of such a pure H3+ ion beam can be adjusted to achieve a similar implantation depth as that achieved using an H+ ion beam.

Referring again to FIG. 2, and consistent with the present embodiments, the RF power supplied by RF generator 108, RF voltage, i.e., the electric field, gas pressure in plasma source chamber 102, and/or gas flow of hydrogen are adjusted to achieve a high concentration of H3+ concentration in the plasma 104. One manner of achieving high process throughput is to expose a substrate 126 to a H3+ ion beam at a relatively higher energy to perform a desired implantation. Measured and calculated kinetic-energy distributions and fluxes of predominant ions in hydrogen glow discharges such as H+, H2+ and H3+ suggest that high concentrations of H3+ ions can be found in these discharges. The H3+ production can be associated with a singular nature of the cross section for the proton transfer reaction: H2++H2→H3++H. A cross section of 4×10-21 m2 for this proton transfer reaction at an energy of about ~10 eV is rather high, which suggests that RF discharges having sufficiently high power densities can be optimized for H3+ production while minimizing destruction of H3+ ions in the plasma sheath region of a plasma chamber. This reaction mechanism usually dominates in the bulk of an RF discharge or in the negative glow of an abnormal dc discharge. The flux of H3+ ions entering the sheath of an RF discharge from the bulk is effectively limited by the radial flow of electrons to the wall of the plasma chamber.

In order to assess the amount H3+ ions produced in an RF induction type plasma source, a secondary ion mass spectrometry (SIMS) data have been examined for silicon wafers implanted in conventional plasma doping PLAD apparatus using a hydrogen plasma at relatively modest power. The results show that the predominant fraction of hydrogen species in the hydrogen plasma are H3+ ions. However, conventional PLAD systems suffer from non-uniform wafer heating rendering such an approach less attractive than beamline ion implantation. However, as previously noted, the beamline ion implantation approach typically used for hydrogen implantation generates predominantly H+ ions, since ion sources used in beamline implanters, such as inductively heated ion sources, are a poor source of H3+ ions. As noted above, the processing systems of the present embodiments may employ apertures that define a ribbon ion beam and thereby limit the surface area of a substrate exposed to an ion beam at any instant and allow the substrate to be scanned with respect to the ion beam as in a beam line ion implantation apparatus. In this manner, wafer heating due to ion implantation is more easily controlled, lessening the effect of any non-uniform heating.

In additional embodiments, a processing system, such as the processing system 200, is used to perform helium and hydrogen co-implantation in a "parallel mode" in which intervals of helium implantation alternate with intervals of hydrogen implantation in a rapid fashion. For example, each hydrogen/helium implantation interval may span tens of microseconds, hundreds of microseconds, several milliseconds, or tens of milliseconds in some embodiments. An advantage of this technique is that it effectively creates a single process step in which the substrate 126 can be scanned with respect to the aperture 132 while receiving co-implantation of both hydrogen and helium ion species, thereby creating a rapid and simple method to introduce into the substrate 126 the species needed for smart cut processing. The term "parallel" as used herein with respect to implantation, refers to the fact that the rapid alternating of multiple periods of helium and hydrogen implantation may appear similar to an actual implantation process in which two respective ion beams of helium and hydrogen are directed simultaneously (in parallel fashion) to a substrate.

In order to perform such parallel mode implantation, a mixture of hydrogen and helium may be admitted at the same time into the plasma source chamber 102. In one embodiment, during a set of high power implantation intervals, a relatively higher RF power is applied to the plasma source chamber 102, which results in ionization of helium gas. It is known that high power plasmas are more effective in ionizing helium gas while low power plasmas are less effective. In this manner, a helium ion beam can be extracted from the plasma source chamber 102 to perform helium implantation. For example, during high power implantation intervals the RF power may be set at a level to produce a plasma potential of about 30-100 V with respect to the potential of the walls of plasma source chamber 102 which is effective in ionizing helium gas whose first ionization potential for helium is about 24.6 V. In a set of low power implantation intervals, the RF power is reduced to a power level at which helium ion generation is much lower, resulting in a plasma in the plasma source chamber 102 that has predominantly hydrogen ions. Since the first ionization potential of hydrogen is about 13.6 V and the first ionization potential for helium is about 24.6 V, during the low power implantation intervals, the RF power applied to plasma source chamber 102 may be chosen to produce energies in a range sufficient to effectively ionize hydrogen while not sufficient to ionize helium. For example, the RF power may be set during low power implantation intervals at a level to produce a plasma potential of about 10-20 V with respect to the potential of the walls of plasma source chamber 102.

Figure 3A:
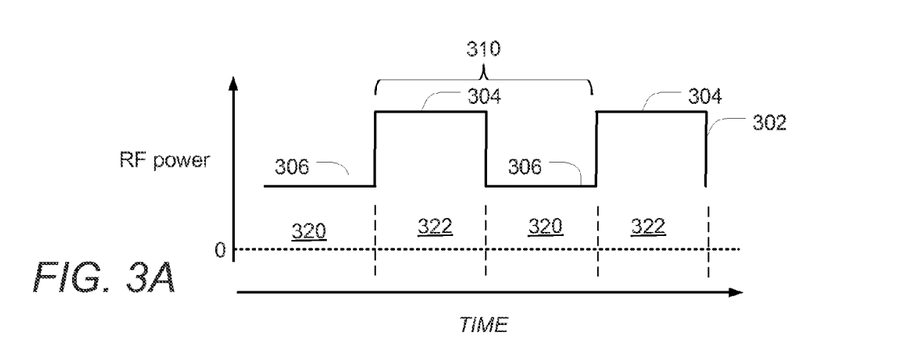
FIG. 3A depicts one exemplary RF power signal that may be applied to a plasma source chamber to perform parallel helium/hydrogen implantation.

FIG. 3A depicts one exemplary RF power signal 302 that may be applied to the plasma source chamber 102 to perform parallel helium/hydrogen implantation. The RF power signal 302 includes high power portions 304 and low power portions 306. The RF power signal 302 may be generated by establishing two power setpoints for the RF generator 108, and rapidly varying the power between the two setpoints. As illustrated, the RF power signal 302 defines two sets of implantation intervals (implantation periods): during the implantation intervals 320 corresponding to low power portions 306, the RF power is maintained at a first set point level that corresponds to relatively lower RF power that is effective to ionize hydrogen but not to ionize helium; during the implantation intervals 322 corresponding to high power portions 304, the RF power is maintained at a second set point level that corresponds to relatively higher RF power effective to ionize helium.

It is further to be noted that in various embodiments, the plasma source is pulsed, whether RF or glow discharge, such that plasma is controlled by controlling pulse duration, pulse duty cycle, and repetition rate.

Figure 3B:
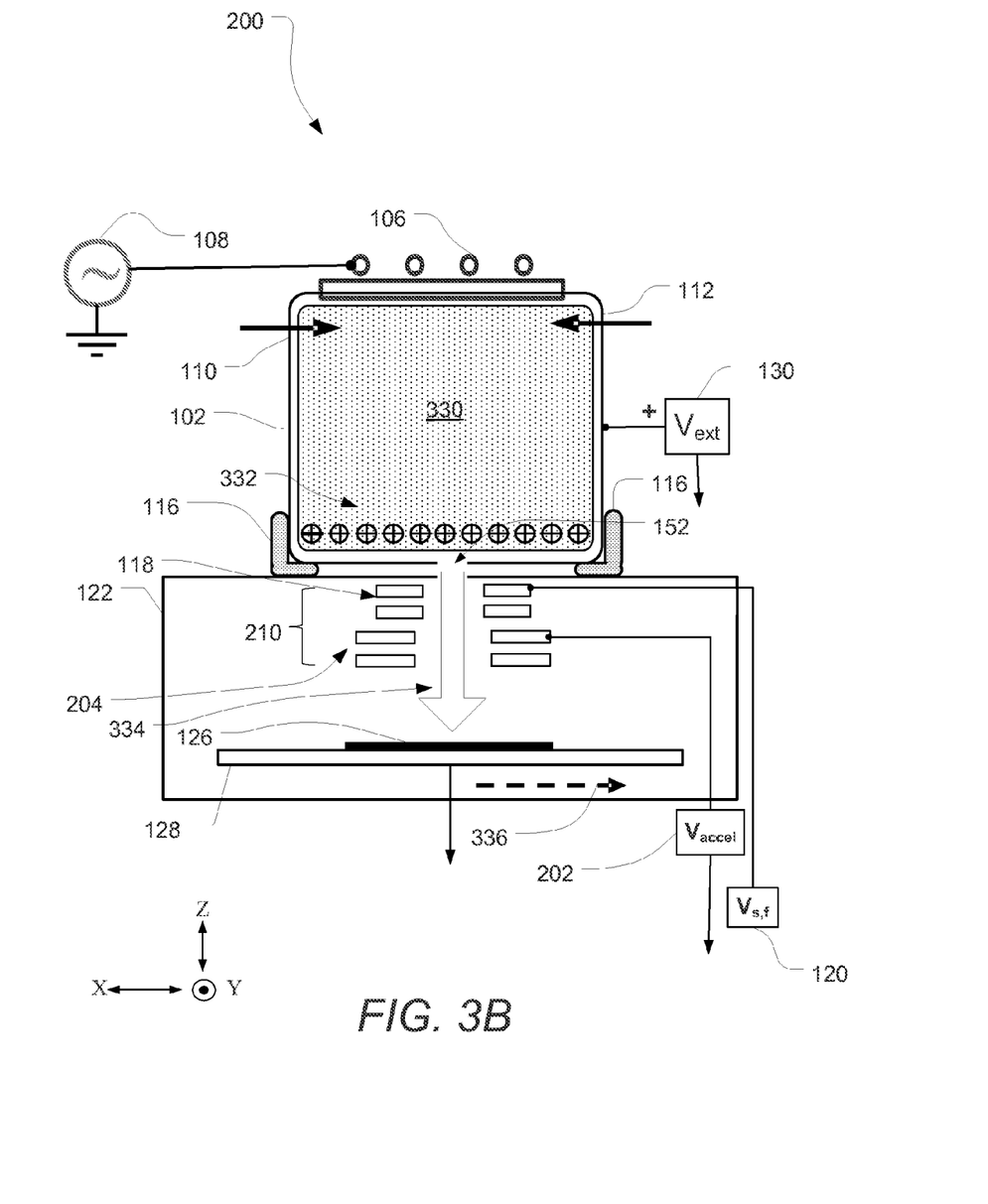
FIG. 3B there is shown a first instance in which a plasma is generated during a first implantation interval.
Figure 3C:
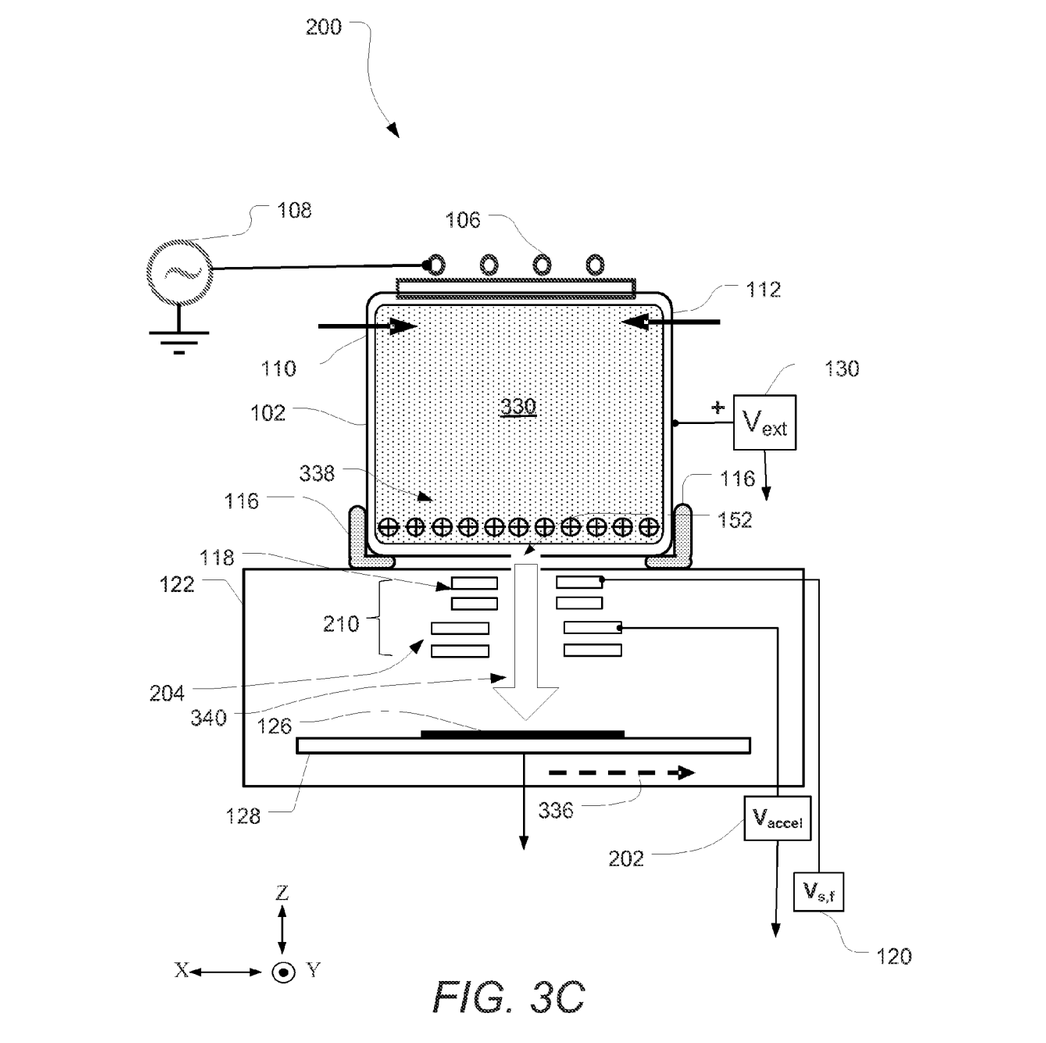
FIG. 3C there is shown another instance in which the plasma is generated in a second implantation interval.

As noted above, in various embodiments the duration of intervals of implanting hydrogen and helium in a parallel mode may be on the order of milliseconds or microseconds. Accordingly, the RF power signal 302 may generate alternating hydrogen and helium ion beams of short duration, as illustrated in FIGS. 3B and 3C. In FIG. 3B there is shown a first instance in which a plasma 330 is generated during an implantation interval 320. This corresponds to a relatively lower plasma power effective for hydrogen ionization. Accordingly, the plasma 330 produces hydrogen ions 332, which are extracted to form a hydrogen ion beam 334 that is implanted into the substrate 126, while the substrate 126 is scanned along the direction 336. In FIG. 3C there is shown another instance in which the plasma 330 has a higher power corresponding to the implantation interval 322. The plasma 330 accordingly produces helium ions 338, which are extracted to form a helium ion beam 340 that is implanted into the substrate 126, while the substrate 126 continues to be scanned along the direction 336. Although the FIGS. 3B and 3C depict the plasma in plasma source chamber 102 as the same plasma 330, it is to be noted that the power level and mix of ion species in the plasma 330 both differ between the instances depicted in FIGS. 3B and 3C, as discussed above. However, the overall composition of neutral gaseous species of hydrogen and helium may remain substantially the same, such that the plasma in FIGS. 3B and 3 shares common properties and is thereby referred to by the same reference number.

As noted previously, in various embodiments the processing systems including processing system 200 may generate an ion beam in the form of a ribbon ion beam whose dimension in the X-direction is on the order of millimeters up to a few centimeters. In some examples the rate of scanning of the substrate 126 under the aperture 152 may be on the order of several millimeters to several centimeters per second, resulting in an exposure of any given portion of substrate 126 to a ribbon ion beam for tenths of seconds to several seconds during a given pass. Accordingly, in embodiments in which the implantation intervals span several milliseconds or less, each portion of the substrate 126 may be exposed to tens, hundreds, or thousands of implantation cycles 310, thereby providing a uniform co-implantation process.

One advantage of the embodiment of FIGS. 3A-3C is that molecular hydrogen ion production can be enhanced by the presence of helium species in the plasma source chamber 102. For example, the production of H3+ ions can be enhanced by the presence of He atoms and Helium metastables (highly excited long lived Helium metastable state) that are present in the plasma 330. In particular, He metastables may contribute to the electron flux and energy of electrons and hot atoms in the bulk of the plasma 330. The present inventors have found that a fraction of molecular hydrogen H3+ ions up to about 90% can be achieved in such hydrogen/helium plasmas. Accordingly, in some embodiments, the overall helium/hydrogen gas ratio in the plasma source chamber 102 may be held constant while the RF power level is varied, as illustrated by the RF power signal 302. Because the presence of helium gas species may enhance H3+ production, during the implantation intervals in which plasma power is insufficient to ionize helium, a high degree of H3+ ions are thereby produce, while during higher power implantation intervals, predominantly helium ions are produced. In this manner, without changing gas composition in a plasma source chamber 102, a parallel co-implantation process that generates rapidly alternating H3+ and helium ion beams can be achieved. In one embodiment, a gas mixture of 50% He/50% H2 is provided in the plasma source chamber 102 and the RF power level is set at 3 kW during the implantation intervals 320. Without changing the gas mixture in the plasma source chamber 102, during the implantation intervals 322, the RF power level may be increased to 6 kW in one instance. Notably, higher RF power and the concomitant higher plasma potentials in the plasma source chamber 102 may serve to extinguish H3+ ions and thereby reduce any hydrogen ion current in the implantation intervals 322.

In other embodiments, a mass analysis assembly is provided between a plasma source chamber and substrate 126 to block helium ions from striking the substrate during a period of hydrogen implantation and/or to block hydrogen ions from striking the substrate 126 during periods of helium implantation. Details of structure an operation of a mass analysis assembly that may be employed in the present embodiments are disclosed in the U.S. patent application Ser. No. 12/981,002, filed Dec. 29, 2010, entitled "system and method for producing a mass analyzed ion beam", and incorporated by reference herein in its entirety.

Figures 3D, 3E:
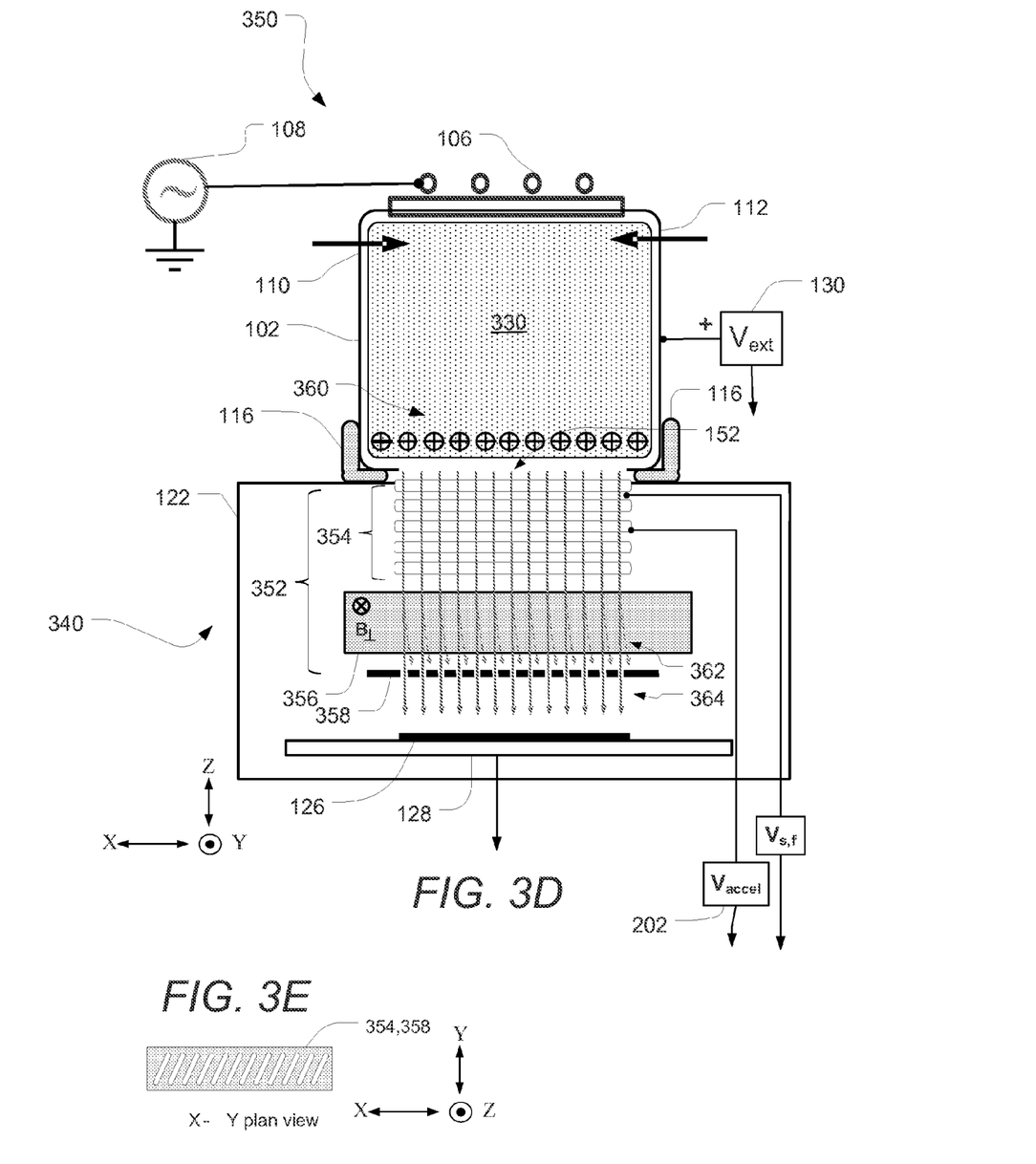
FIG. 3D depicts one embodiment of a processing system.
FIG. 3E depicts an aperture structure of an exemplary mass analyzer.

FIG. 3D depicts one embodiment of a processing system 350 that illustrates general features of a mass analysis assembly 352 to analyze ions extracted from the plasma source chamber 102. The mass analysis assembly 352 includes an extraction/acceleration assembly 354, magnetic assembly 356, and mass analyzer 358. Ions 360 that are generated in the plasma 330 may include a mixture of helium and hydrogen ions, and in particular H3+ ions. Although variation of RF power between two different power levels using, for example, the RF power signal 302, may alternately generate plasmas that are rich in either He or H3+ ions, both species may persist at each power level. In such cases, ions extracted from the plasma source chamber 102 may contain a mix of hydrogen and helium ions in both implantation intervals 320 and 322. Accordingly, the mass analysis assembly 352 may be used to filter out the undesired ion species for a give implantation interval. In particular, as shown in FIG. 3D, ions 360 as they emerge from the plasma source chamber 102 may include both helium ions 364 and hydrogen ions 362. The ions 360 pass through a magnetic assembly 356 which generates a magnetic field perpendicular to the direction of propagation of the ions 360 thereby providing a deflecting force that is also generally perpendicular (along the X-direction) to the direction of travel (along the Z-direction). Helium ions 364 are deflected to a lesser along the X-direction than are H3+ ions 362. Accordingly, the mass analyzer 358 may be positioned to block H3+ ions 362 while transmitting helium ions 364. As illustrated, the extraction/acceleration assembly 354 may contain multiple plates (electrodes) each of which may have angled slots as illustrated in FIG. 3E. In particular, FIG. 3E depicts an aperture structure that may be common to both plates within the extraction/acceleration assembly 354 and the mass analyzer 358. Thus emerging ions 360 are broken into a series of beamlets by the extraction/acceleration assembly 354. In this manner, ions within the individual beamlets need only be deflected a small distance in the X-direction to be intercepted by the mass analyzer 358.

The strength of the magnetic field and dimension of the magnetic field along the Z-direction may be adjusted to provide adequate mass analysis capability. In one example, for 10 keV ions subjected to a perpendicular magnetic field of 200 Gauss, a throw distance between the extraction assembly 354 and mass analyzer 358 of 30 cm provides a differential deflection along the X-direction between He ions and H3+ ions of about 2-3 mm, which is sufficient to provide mass analysis using apertures having a similar aperture width and separation.

It is to be noted that during implantation periods in which H3+ ions 362 are to be transmitted to the substrate 126, the applied magnetic field may be adjusted and/or mass analyzer 358 shifted along the X-direction to block helium ions while passing the H3+ ions. However in some embodiments it may be necessary or convenient to only analyze ion species during only one of the ion implantation intervals 320 or 322. For example, it may be observed that helium ion contamination of an H3+ ion beam generated during an implantation interval 320 may be less of a concern than hydrogen contamination of a helium ion beam during an implantation interval 322. Accordingly, during the implantation intervals 322, a magnetic field may be generated to deflect hydrogen ions into the magnetic analyzer 358 while during the implantation intervals 320 the magnetic field may simply be extinguished (in the case of an electromagnet) to allow the now-undeflected hydrogen ions to pass through the magnetic analyzer 358.

Figure 4A:
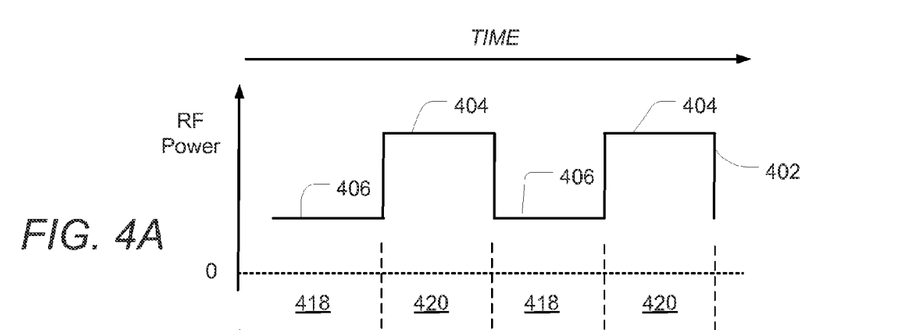
FIGS. 4A and 4B depict exemplary signals for implementation of parallel ion implantation.
Figure 4B:
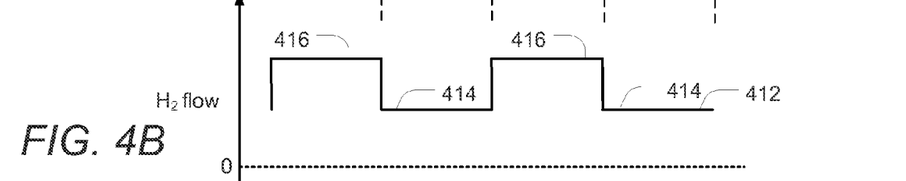
Figure 4C:
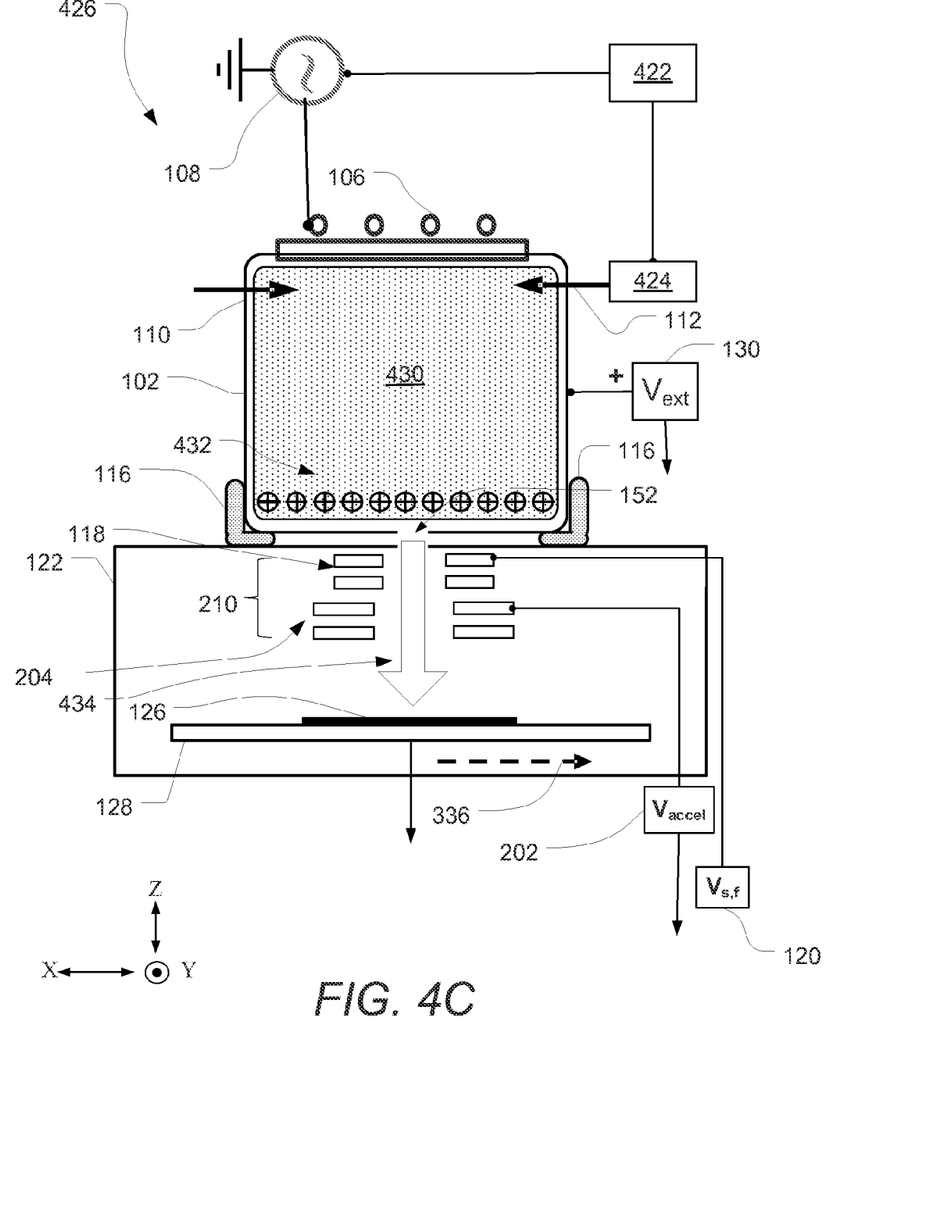
FIG. 4C further illustrates an embodiment of a processing system.

In further embodiments, both the gas composition and RF power level may be varied to achieve a parallel implantation process. FIGS. 4A and 4B together depict one implementation of parallel ion implantation. In FIG. 4A an RF power signal 402 is generated, which includes high power portions 404 and low power portions 406 in a manner similarly to that described above with respect to FIG. 3A. When this RF power signal 402 is applied to a plasma source chamber 102, the content of the plasma generated therein may rapidly vary between hydrogen molecular ions, such as predominantly H3+, and helium ions, as described above with respect to FIGS. 3A-3C. In addition, as shown in FIG. 4B, a flow control signal 412 is generated, which includes low flow rate portions 414 and high flow rate portions 416. In one example the flow control signal 412 may be coupled to a valve or to a flow controller 424, as illustrated in FIG. 4C, to alter the rate of flow of hydrogen into the plasma source chamber 102. As further shown in FIG. 4A, the flow control signal 412 may be synchronized with the RF power signal 402, such that the low flow rate portions 414 coincide with the high power portions 404, and high flow rate portions 416 coincide with the low power portions 406. FIG. 4C further illustrates an embodiment of a processing system 426 in which a process synchronizer 422 is coupled both to the RF generator 108 and the flow controller 424. The process synchronizer 422 may generate signals that direct the synchronization of the flow control signal 412 and RF power signal 402 as shown in FIGS. 4A and 4B. It is therefore consistent with the present embodiments to modulate the RF power only without modulating the gas flow, or to employ synchronization of the gas flow without changing the RF power.

In this manner, during implantation intervals 418 in which RF power is lower and hydrogen molecular ion formation favored over helium ion formation, the flow rate of hydrogen may be increased to further enhance the formation of H3+. During the implantation intervals 420 in which RF power is higher such that helium ion formation is formed, the flow rate of hydrogen may be decreased to generate a more pure helium ion beam. In this manner, the ions 432 generated in the plasma 430 may vary with time between helium and H3+.leading to a similar fluctuation with time in the composition of ions in the ion beam 434.

Figure 4D:
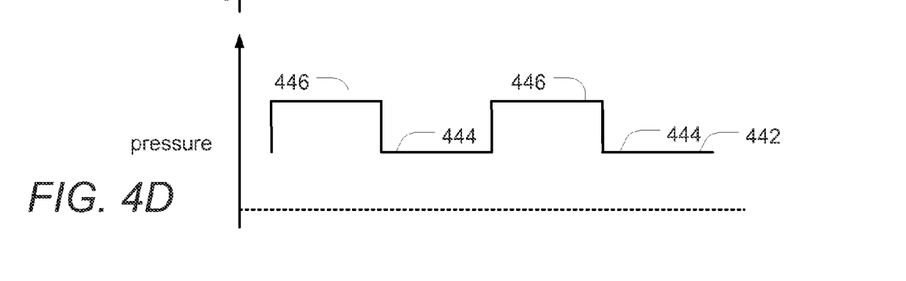
FIG. 4D illustrates pressure control consistent with the present embodiments.

In further embodiments, in addition to or instead of changes in gas flow rate, total pressure in the plasma source chamber may be varied in a manner that is coupled to changes in RF power. FIG. 4D illustrates a pressure control curve 442, which includes low pressure portions 444 and high pressure portions 446. In one example the pressure control curve 442 may be synchronized with the RF power signal 402, such that the low pressure portions 444 coincide with the high power portions 404, and high pressure portions 446 coincide with the low power portions 406. In one example, the pressure during low pressure portions 444, the pressure in ion source chamber 102 may be on the order of one milliTorr pressure, while during the high pressure portions 446 the pressure may be tens of milliTorr or higher.

Figure 5:
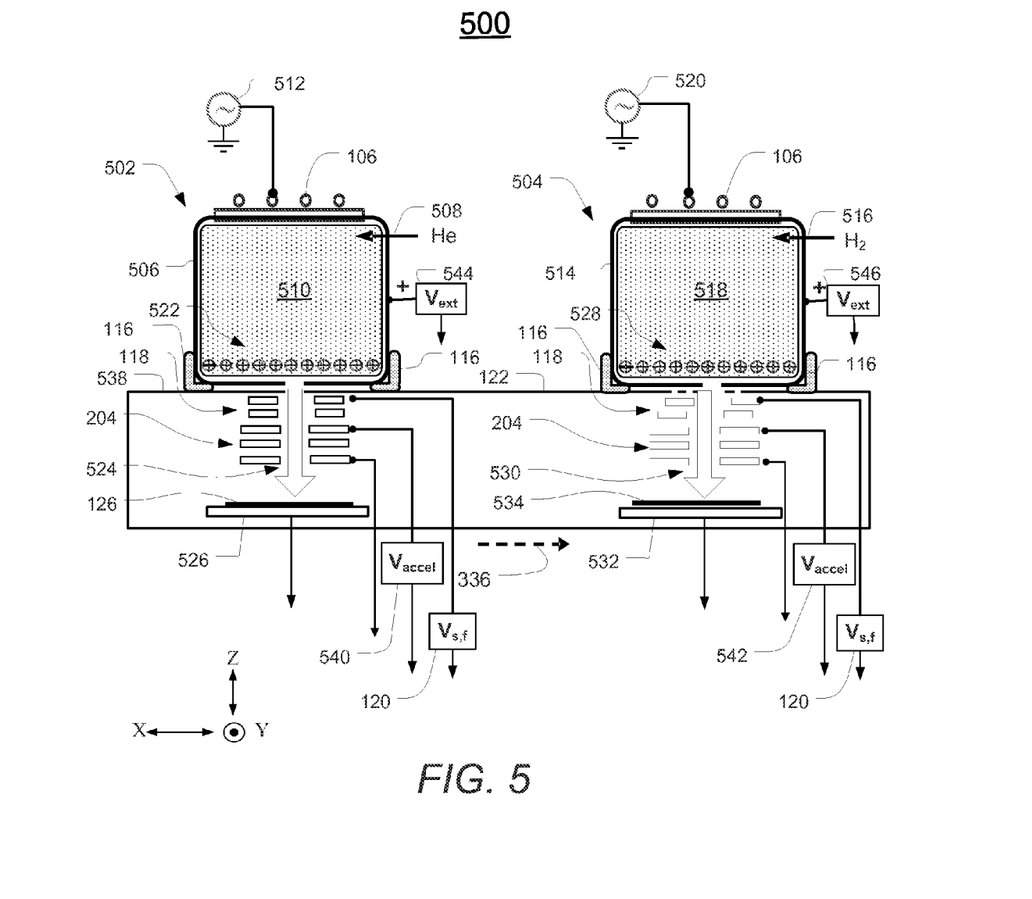
FIG. 5 depicts another processing system.

In further embodiments, two separate plasma sources are employed for co-implantation of two different species. FIG. 5 depicts a processing system 500 that includes a first ion beam source 502 and second ion beam source 504. Each of the ion beam sources 502, 504 is in communication with a substrate chamber 538 discussed further below. The ion beam source 502 includes a plasma source chamber 506 coupled to a gas inlet 508, which is configured to flow He into the plasma source chamber in the example shown in FIG. 5. A plasma 510 is generated when helium gas is present in the plasma source chamber 506 and the RF generator 512 provides power to the induction coil 106. Other components of the ion beam source 502 are common to the processing systems 100 and 200 disclosed above and are not discussed further herein.

The ion beam source 504 includes a plasma source chamber 514 coupled to a gas inlet 516, which is configured to flow hydrogen into the plasma source chamber in the example shown in FIG. 5. A plasma 518 is generated when hydrogen gas is present in the plasma source chamber 514 and the RF generator 520 provides power to the induction coil 106. Other components of the ion beam source 504 are common to the processing systems 100 and 200 disclosed above and are not discussed further herein.

In operation, helium ions 522 are generated in the plasma source chamber 506 and a helium ion beam 524 is directed toward the substrate 126 to perform a helium implantation at a required depth in the substrate 126. To perform hydrogen implantation, the substrate 126 may be transferred to a position proximate the plasma source chamber 514. In one example, the substrate holder 526 may be coupled to a stage (not shown) or other transfer mechanism that is configured to move the substrate along the direction 336. Illustrated in FIG. 5, a second substrate 534 is located on a substrate holder 532 proximate the plasma source chamber 514 at the instance in which the substrate 126 is located proximate the plasma source chamber 506. The second substrate 534 may have been already implanted with helium in one example. As further shown in FIG. 5, hydrogen ions 528 are extracted to form a hydrogen ion beam 530 that is implanted into the second substrate 534 to achieve a depth to match a previous helium implant. In accordance with various embodiments the substrate holders, 526, 532 may be equipped with or coupled to cooling or heating components (not shown) to maintain desired substrate temperature during the implantation of He and/or hydrogen. In addition, the ion energy for helium implantation and hydrogen implantation may be independently set using the respective accelerator voltage supplies Vaccel 540, 542 and/or voltage sources Vext 544, 546 that are coupled to respective ion beam sources 502, 504.

In still further embodiments, ion energy may be varied between hydrogen and helium implantation intervals during parallel implantation from a single plasma source chamber. In one example, a variable level of RF power is applied to the plasma source chamber 102 simultaneously with variation in the voltage level Vext as illustrated in FIGS. 6A and 6B.

Figure 6A:
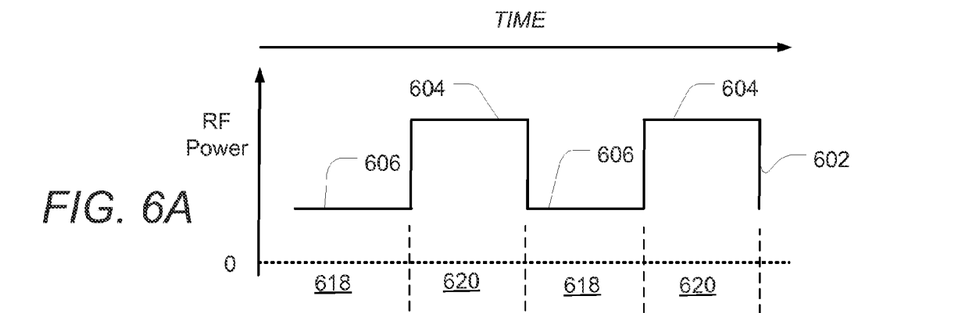
FIG. 6A depicts an exemplary RF power signal.
Figure 6B:
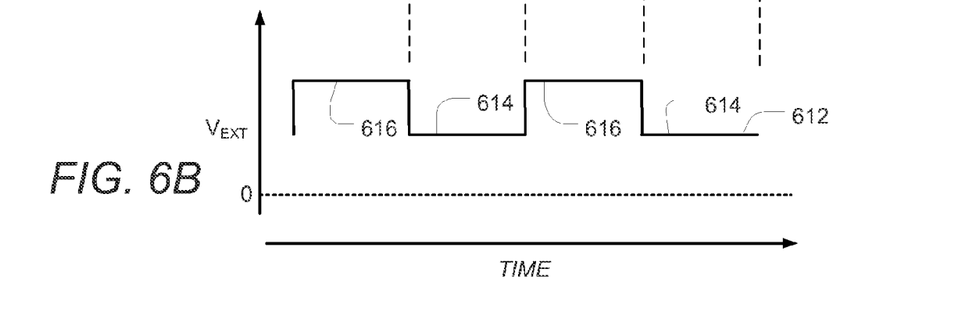
FIG. 6B depicts an exemplary voltage signal.

FIG. 6A depicts an RF power signal 602 includes high power portions 604 and low power portions 606. As illustrated, the RF power signal 602 defines two sets of implantation intervals: during the implantation intervals 618 corresponding to low power portions 606, the RF power is maintained at a first set point level that corresponds to relatively lower RF power effective to ionize hydrogen but not to ionize helium; during the implantation intervals 620 corresponding to high power portions 604, the RF power is maintained at a second set point level that corresponds to relatively higher RF power effective to ionize predominantly helium. FIG. 6B depicts a Vext signal 612 that includes high voltage portions 616 and low voltage portions 614. As illustrated, the high voltage portions 616 and low voltage portions 614 of the Vext signal 612 occur during the respective implantation intervals 618 and 620. Thus, during hydrogen implantation (implantation intervals 618), the plasma potential of a plasma source chamber which is set by Vext is lower than during helium implantation (implantation intervals 620). In this manner, the energy of hydrogen ions may be set somewhat lower than that of corresponding helium ions in order to adjust for the different energy dependence of implantation depth for He as opposed to H3.

Figure 6C:
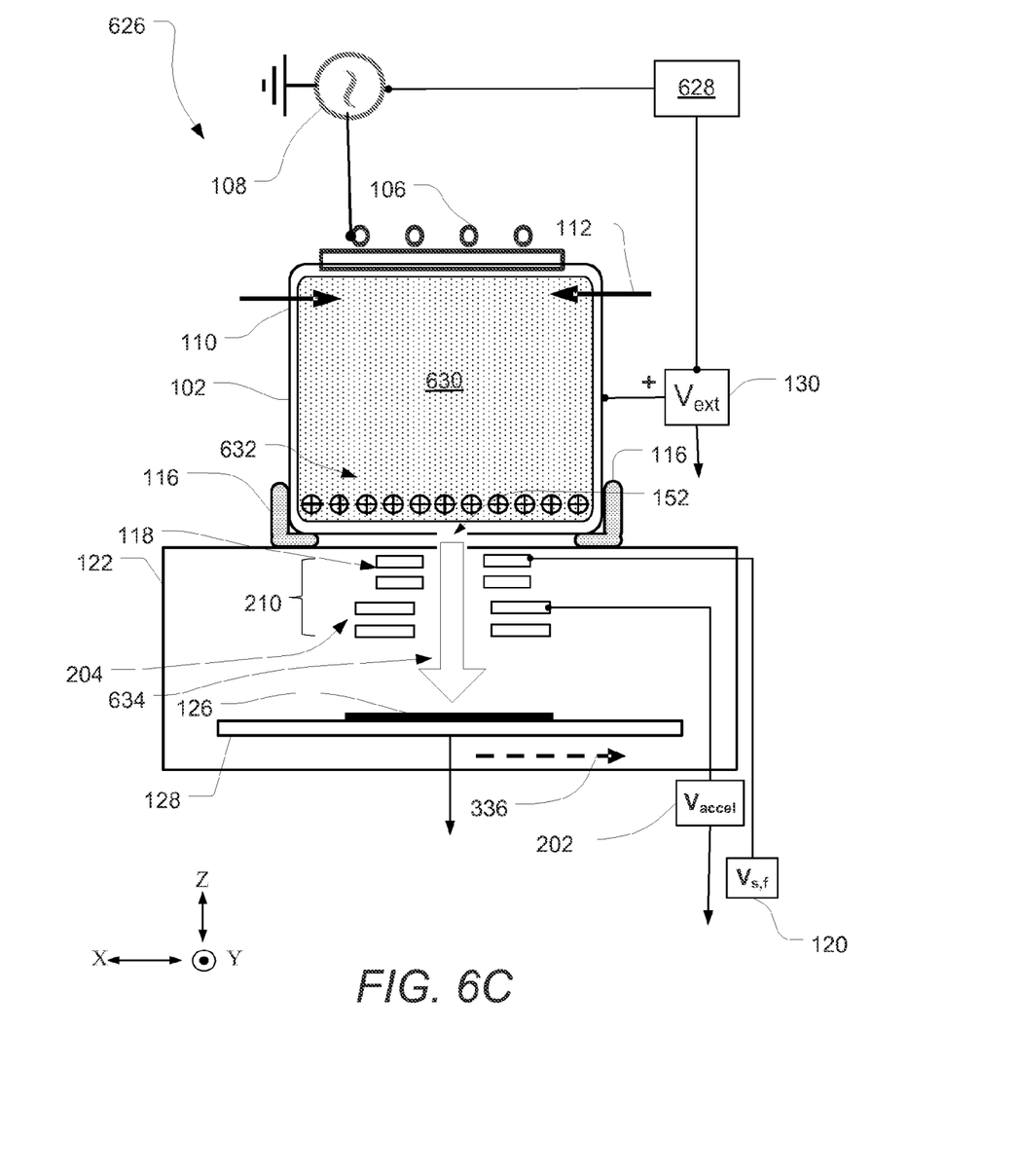
FIG. 6C further illustrates an embodiment of a processing system.

FIG. 6C further illustrates an embodiment of a processing system 626 in which the process synchronizer 628 is coupled both to the RF generator 108 and the Vext voltage supply 130. The process synchronizer 628 may generate control signals that direct the synchronization of the RF power signal 602 and Vext signal 612 as illustrated in FIGS. 6A and 6B. Accordingly, as the signals 602, 612 are applied in synchronization, the ion composition of ions 632 produced in plasma 630 may vary between predominantly He+ to predominantly H3+ while the ion energy of the ion beam 634 varies in concert with the changes in ion composition.

In further embodiments, to adjust implantation energy between helium and hydrogen implantation, instead of varying Vext voltage level in conjunction with variation in RF power level, the voltage Vacc applied to the acceleration assembly 204 may be varied in synchronization with variation in RF power level. The latter approach also results in variation of ion energy between helium and hydrogen implantation periods.

In various additional embodiments, RF power in a plasma chamber may be varied in conjunction with ON/OFF pulsing of Vext. Such ON/OFF pulsing of Vext may be used to define pulse periods (distinct from the implantation intervals discussed above), where one pulse period is composed of a portion in which a positive bias is applied to Vext and a portion in which Vext is zero. Because the substrate is grounded, the portions when Vext is zero represent OFF portions in which no implantation takes place because ions are not accelerated out of the plasma chamber. During ON portions of the pulse period ions are accelerated from a plasma with an energy defined by the level of Vext. In one example the pulse frequency F may be set to 5 kHz, yielding a pulse period of 200 s: Within this pulse period the ON portion may be subdivided into different implantation intervals in which plasma power is varied. For example, if the pulse period is assumed to begin a time t=0, during a first implantation interval between 0-10 s power may be set to 1 kW; at a second implantation interval between 10 to 100 s power is set to 2 kW; at a third implantation interval between 100 to 150 s power is set at 3 kW; and at a final interval between 150 and 200 s power is set to 0 kW. In the above example, the final interval where plasma power is zero may correspond to an OFF period in which Vext. is zero. Accordingly, the ON portion of a pulse period in the above example the ON portion is 150 s in duration and the OFF portion is 50 s in duration and s. In various other embodiments the plasma power levels may be rapidly varied between up to four different power levels during an ON portion. This facilitates the ability to rapidly vary composition of ions extracted from a plasma from hydrogen-rich to helium-rich in a graded fashion.

Referring again to FIG. 1, in still further embodiments, rather than implanting ions parallel to the normal 127 of a substrate 126, ions may be directed at an angle, such as 7 degrees from the substrate normal. This may reduce channeling effects of ions along crystallographic planes of the substrate 126, thereby increasing the efficiency of the smart cut process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An apparatus for hydrogen and helium implantation, comprising:
a plasma source system to generate helium ions and hydrogen molecular ions comprising $H_3^+$ ions,
a substrate chamber adjacent the plasma source system and in communication with the plasma source system via one or more apertures;
an extraction system to extract the hydrogen molecular ions and the helium ions from the plasma source system; and
an acceleration system to accelerate extracted helium and hydrogen molecular ions to a predetermined energy and direct the extracted helium ions and hydrogen molecular ions to a substrate,
the plasma source system comprising a first plasma source to generate the hydrogen molecular ions and a second plasma source to generate the helium ions,
the extraction system comprising a first extraction assembly to extract the hydrogen molecular ions and second extraction assembly to extract the helium ions,
the acceleration system comprising a first acceleration assembly to accelerate the extracted hydrogen molecular ions and second acceleration assembly to accelerate the extracted helium ions.

2. The apparatus of claim 1, the extraction system and acceleration system interoperative to produce a ribbon ion beam having a cross-sectional width and cross-sectional length at least two times the cross-sectional width.

3. The apparatus of claim 1, wherein the plasma source system comprising a plasma source having a first inlet configured to receive hydrogen gas and a second inlet configured to receive helium gas.

4. The apparatus of claim 1, further comprising a mass analysis assembly disposed between the acceleration assembly and the substrate and configured to block hydrogen ions from reaching the substrate and to simultaneously transmit helium ions to the substrate.

5. The apparatus of claim 1, wherein
the plasma source system comprising a single plasma source to generate the helium ions and hydrogen molecular ions, and further comprising
an RF generator operative to alternate power delivered to the plasma source between a first power level during a first set of implantation periods, and a second power level during a second set of implantation periods, the first power level effective to generate plasma energy of the first plasma above a first ionization threshold of helium, and the second power level effective to generate hydrogen molecular ions and to generate plasma energy of the first plasma below a first ionization threshold of helium.

6. The apparatus of claim 5, further comprising:
a flow controller to set a first hydrogen gas flow rate into the single plasma source for a first set of flow periods and a second hydrogen gas flow rate into the plasma source for a second set of flow periods; and
a process synchronizer to generate signals to synchronize the first set of implantation period with the first set of flow periods and the second set of implantation periods with the second set of flow periods.

7. The apparatus of claim 1, further comprising:
a voltage source operative to apply a pulsed voltage over a plurality of pulse periods between the plasma chamber and substrate, a pulse period comprising a first portion in which positive voltage is applied and a second portion in which zero voltage is applied; and
an RF generator operative to vary power delivered to the plasma source between two to four different power levels at least during the first portion of the pulse periods.

8. A method to process a substrate using ion implantation, comprising:
generating hydrogen molecular ions comprising $H_{3hu}$ +ions in a first set of plasma conditions during a first set of implantation periods;
generating helium ions in a second set of plasma conditions during a second set of implantation periods;
directing a first ion beam containing the $H_3^+$ ions to the substrate during the first set of implantation periods; and
directing a second ion beam containing the helium ions to the substrate during the second set of implantation periods.

9. The method of claim 8, wherein the generating the hydrogen molecular ions comprising generating a first plasma in a first plasma source, and the generating the helium ions comprising generating a second plasma in a second plasma source different from the first plasma source, the method further comprising:
between the directing the beam containing the molecular hydrogen ions and the directing the beam containing the helium ions, transporting the substrate from a first position configured to receive ions from the first plasma source to a second position configured to receive ions from the second plasma ion source.

10. The method of claim 9, further comprising:
generating the first ion beam as a first ribbon beam having a cross-sectional width along a first direction and a cross-sectional length along a second direction perpendicular to the first direction at least two times the cross-sectional width;
generating the second ion beam as a second ribbon beam having a cross-sectional width along the first direction and a cross-sectional length at least two times the cross-sectional width along the second direction; and
moving the substrate in the first direction for a distance effective to expose a predetermined portion of the substrate to the first ion beam and the second ion beam.

11. A processing system for co-implantation into a substrate, comprising:
a plasma source;
an RF generator comprising a first set point and a second set point, the RF generator configured to alternate power delivered to the plasma source between a first power level corresponding to the first setpoint during a first set of implantation periods, and a second power level corresponding to the second setpoint during a second set of implantation periods,
the first power level effective to generate plasma energy of a plasma that is above a first ionization threshold of helium, and the second power level effective to generate $H_3^+$ ions and to generate plasma energy of the plasma below a first ionization threshold of helium; and
an acceleration assembly to accelerate helium ions from the plasma source to a first predetermined energy and direct the helium ions to the substrate during the first set of implantation periods and to and to accelerate $H_3^+$ ions from the plasma source to a second predetermined energy and direct the $H_3^+$ ions to the substrate during the second set of implantation periods.

12. The processing system of claim 11, further comprising an extraction system to extract ions from the plasma source, the extraction system and acceleration system interoperative to produce a ribbon ion beam having a cross-sectional width and cross-sectional length at least two times the cross-sectional width.

13. The apparatus of claim 11, further comprising a mass analysis assembly disposed between the acceleration assembly and the substrate and configured to block hydrogen ions from reaching the substrate and to simultaneously transmit helium ions to the substrate.

14. The apparatus of claim 11, further comprising:
a voltage generator to set a first plasma source chamber voltage for a first set of intervals and a second plasma source voltage for a second set of intervals; and
a synchronizer to generate signals to synchronize the first set of intervals with the first set of implantation periods and the second set of intervals with the second set of implantation periods.

* * * * *